United States Patent
Sambi et al.

(10) Patent No.: US 11,282,954 B2
(45) Date of Patent: Mar. 22, 2022

(54) LDMOS DEVICE WITH INTEGRATED P-N JUNCTION DIODES

(71) Applicant: STMicroelectronics S.r.l., Agrate Brianza (IT)

(72) Inventors: Marco Sambi, Cornaredo (IT); Michele Basso, Cusano Milanino (IT); Stefano Corona, Borgarello (IT); Leonardo Di Biccari, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 130 days.

(21) Appl. No.: 16/664,121

(22) Filed: Oct. 25, 2019

(65) Prior Publication Data
US 2020/0135919 A1    Apr. 30, 2020

(30) Foreign Application Priority Data

Oct. 30, 2018    (IT) .................. 102018000009902

(51) Int. Cl.
| H01L 29/78 | (2006.01) |
| H01L 27/02 | (2006.01) |
| H01L 29/06 | (2006.01) |
| H01L 29/423 | (2006.01) |

(52) U.S. Cl.
CPC ...... H01L 29/7818 (2013.01); H01L 27/0255 (2013.01); H01L 29/0649 (2013.01); *H01L 29/42368* (2013.01)

(58) Field of Classification Search
CPC ............. H01L 29/7818; H01L 29/7819; H01L 27/0255
See application file for complete search history.

(56) References Cited

U.S. PATENT DOCUMENTS

| 6,133,107 A * | 10/2000 | Menegoli ............ H01L 27/0727 |
| | | 257/E27.033 |
| 7,420,260 B2 * | 9/2008 | Kwon ................... H01L 21/761 |
| | | 257/386 |
| 7,541,247 B2 * | 6/2009 | Voldman ............. H01L 29/0619 |
| | | 257/E21.544 |
| 2005/0073007 A1 * | 4/2005 | Chen ................... H01L 29/1083 |
| | | 257/355 |
| 2006/0011974 A1 * | 1/2006 | Pendharkar ......... H01L 29/7816 |
| | | 257/334 |

(Continued)

OTHER PUBLICATIONS

IT Search Report and Written Opinion for IT Appl. No. 102018000009902 dated Jun. 18, 2019 (7 pages).

*Primary Examiner* — Younes Boulghassoul
(74) *Attorney, Agent, or Firm* — Crowe & Dunlevy

(57) ABSTRACT

A structural body made of semiconductor material includes an active area housing a drain region, a body region and a source region within the body region. An electrical-isolation trench extends in the structural body to surround the active area. A first PN-junction and a second PN-junction are integrated in the structural body between the active area and the trench, respectively located on opposite sides of the active area. The first and the second PN-junctions form a first diode and a second diode, with each diode having a respective cathode electrically coupled to the drain region of the MOSFET device and a respective anode electrically coupled to the source region of the MOSFET device.

32 Claims, 3 Drawing Sheets

(56) References Cited

U.S. PATENT DOCUMENTS

| | | | |
|---|---|---|---|
| 2006/0226499 A1* | 10/2006 | Shimizu | H01L 29/66568 257/409 |
| 2006/0255411 A1* | 11/2006 | Suzuki | H01L 29/8611 257/360 |
| 2007/0132008 A1* | 6/2007 | Kang | H01L 27/0761 257/316 |
| 2008/0283908 A1* | 11/2008 | Pang | H01L 29/7819 257/328 |
| 2010/0140703 A1* | 6/2010 | Ko | H01L 29/0619 257/343 |
| 2014/0001473 A1* | 1/2014 | Chen | H01L 27/0629 257/49 |
| 2019/0189610 A1* | 6/2019 | Tanaka | H01L 27/0629 |

* cited by examiner

US 11,282,954 B2

LDMOS DEVICE WITH INTEGRATED P-N JUNCTION DIODES

PRIORITY CLAIM

This application claims the priority benefit of Italian Application for Patent No. 102018000009902, filed on Oct. 30, 2018, the content of which is hereby incorporated by reference in its entirety to the maximum extent allowable by law.

TECHNICAL FIELD

The present invention relates to an improved MOSFET device and a method of manufacturing the MOSFET device. In particular, the MOSFET device has an integrated diode with improved robustness.

BACKGROUND

FIG. 1 is a schematic illustration of a portion of a driving circuit 12 (a half bridge circuit), configured to drive an inductive load 18, such as an electric motor, a speaker or the like.

In greater detail, the driving circuit 12 comprises a power-supply terminal 12a at voltage $V_{IN}$ and voltage-reference terminal biased at a reference voltage GND. The driving circuit 12 further includes a high-side switch 13 and a low-side switch 14, connected in series with one another between the supply terminal 12a and the reference terminal GND. In particular, the high-side switch 13 is connected directly to the supply terminal 12a for receiving the signal $V_{IN}$, and the low-side switch 14 is connected directly to the reference terminal GND.

According to an embodiment of a known type (FIG. 2), both the high-side switch 13 and the low-side switch 14 are MOSFET, in particular n-channel high voltage HV MOS (most specifically, a DMOS), devices with body and source terminals short-circuited.

In greater detail, the drain terminal D of the high-side switch 13 is connected to the supply terminal 12a, the source terminal S of the high-side switch 13 is connected to the drain terminal of the low-side switch 14, and the source terminal S of the low-side switch 14 is connected to the reference terminal GND. The high-side switch 13 and low-side switch 14 are driven in conduction by a first driving circuit 25 and a second driving circuit 26, respectively. The driving circuits 25, 26 have outputs that are connected to the control terminal (gate terminal) G of the transistors that form the high-side switch 13 and low-side switch 14.

FIG. 2 shows, in dashed line, a diode 15 and a diode 16 coupled between a respective source terminal S and a respective drain terminal D of the high-side switch 13 and of the low-side switch 14. As it is known, the source terminal is formed within a body region, so that the diodes 15 and 16 are actually coupled between a respective source/body terminal S and a respective drain terminal D of the switches 13 and 14.

The diodes 15 and 16 are intrinsic diodes of the MOS-FETs 13 and 14 (and are also known as "free-wheeling diodes"). The diodes 15 and 16 are connected in antiparallel configuration (with respect to the normal direction of flow of the current through the high-side switch 13 and the low-side switch 14).

As is known, a characteristic of a MOSFET is that of displaying, under certain operating conditions, the electrical properties of a diode (parasitic diode). Diodes 15 and 16 are therefore electrically interposed (more specifically, integrated) between the source/body and drain terminals of the respective MOSFET. In other words, the high-side switch 13 and the low-side switch 14 can present the electrical behavior of a diode, where the cathode of the diode corresponds to the drain terminal and the anode to the source/body terminal of the respective high-side switch 13 and low-side switch 14 (vice versa, in the case of p-type MOSFETs).

During use, due to the physical properties of an inductive load (such as load 18), once a current is flowing in one direction such direction is to be maintained. This is also true when the bridge 12 is disabled or when an opposing voltage polarity is applied. Not giving a safe path for this current to flow, while it decays down to zero or switches to the new direction, may result in a damage of the bridge 12, specifically of the switches 13, 14. A proper path for this current decay is often offered by the intrinsic diodes 15, 16, which start conducting as soon as the switches 13, 14 are disabled. For high and/or fast recirculation currents, however, the intrinsic diodes 15, 16 may not be sufficient to provide a proper path and may be subject to damage, with a consequent damage of the respective MOSFET 13, 14 integrating the damaged diode.

A more efficient way to handle this current may consist in providing external diodes, as shown in FIG. 3. In FIG. 3, further diodes 20, 21 are coupled in parallel to intrinsic diodes 15 and, respectively, 16. In this way, by properly choosing the diodes 20, 21 (e.g., Schottky diodes), it is possible to improve the robustness of the circuit to higher and faster recirculating currents and manage recirculating currents of higher value than the solution of FIG. 2.

Other solutions are possible. In one known embodiment, it is possible to enable/disable the switches 13, 14 in a sequence, for them to carry the decaying current without causing shoot through.

Other current recirculation methods are known in the art, but are not further discussed. The solution of FIG. 3, as well as the alternative solutions, has drawbacks. The embodiment of FIG. 3 foresees the use of additional components (i.e., the diodes 20, 21) which cause area consumption, additional costs and are possible sources of current leakage. The alternative solutions foresee the design and development of specific control logic for the switches 13, 14 to compensate for the structural deficiencies of the driving circuit. This implies an increment of the design costs and the necessity of adapting the control logic to the diverse operative and load conditions.

There is accordingly a need in the art to provide a MOSFET device and a manufacturing method thereof that overcome the aforesaid issues and disadvantages.

SUMMARY

In an embodiment, a MOSFET device comprises: a structural body made of semiconductor material; an active area housing a drain region, a body region and a source region within the body region, wherein the drain region, body region and source region are reciprocally arranged such that, during use, a current path is formed between the drain and the source regions along a first axis; a first PN-junction and a second PN-junction integrated in the structural body externally to the active area, respectively arranged at least in part on opposite sides of the active area along said first axis; wherein the first and the second PN-junctions form a first and a second diode each having a respective cathode electrically coupled to one among the drain region and the source region of the MOSFET device and a respective anode electrically coupled to the other among the source region and the drain region of the MOSFET device.

In an embodiment, a MOSFET device comprises: a semiconductor body surrounded by an insulating frame; an active region within the semiconductor body, said active region comprising a drain region doped with a first conductivity type, a body region doped with a second conductivity type in contact with the drain region and a source region doped with the first conductivity type within the body region; a first junction region within the semiconductor body, said first junction region doped the second conductivity type and positioned in contact with the drain region; a second junction region within the semiconductor body, said second junction region doped the first conductivity type and positioned in contact with the first junction region; wherein the first and second junction regions form a PN-junction of a diode; and an electrical connection of the second junction region to the drain region.

In an embodiment, a method of manufacturing a MOSFET device comprises: forming, in a structural body of semiconductor material, a drain region, a body region, and a source region within the body region, thus defining an active area, wherein the drain region, the body region and the source region are reciprocally arranged such that, during use, a current path is formed between the drain and the source regions along a first axis; integrating a first PN-junction and a second PN-junction in the structural body externally to the active area, respectively arranged at least in part on opposite sides of the active area along said first axis, thus forming a first diode and a second diode, respectively; and electrically coupling a cathode of the first and second diodes, respectively, to one among the drain region and the source region of the MOSFET device and electrically coupling an anode of the first and second diodes, respectively, to the other among the drain region and the source region of the MOSFET device.

BRIEF DESCRIPTION OF THE DRAWINGS

For a better understanding of the present invention, preferred embodiments thereof are now described, purely by way of non-limiting example and with reference to the attached plates of drawings, wherein.

DETAILED DESCRIPTION

Figure 1:
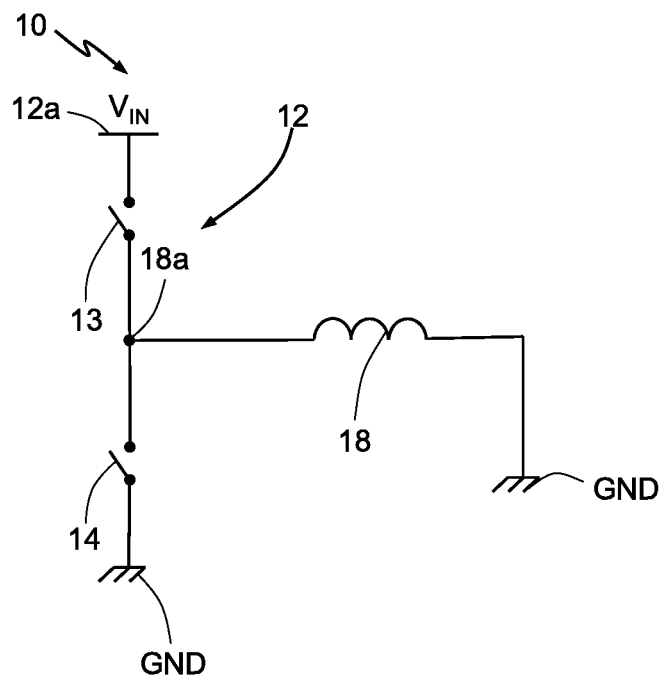
FIGS. 1-3 are schematic illustrations of a portion of a respective driving circuit configured to drive an inductive load, according to the known art.

According to an embodiment, there is provided an integrated electronic device, in particular a field effect transistor (FET), more particularly a double diffused MOS transistor (DMOS), of an improved type. The device is identified, in the following disclosure, with reference numeral 30. The device 30 is integrated in a die, or chip, 31.

Figure 5:
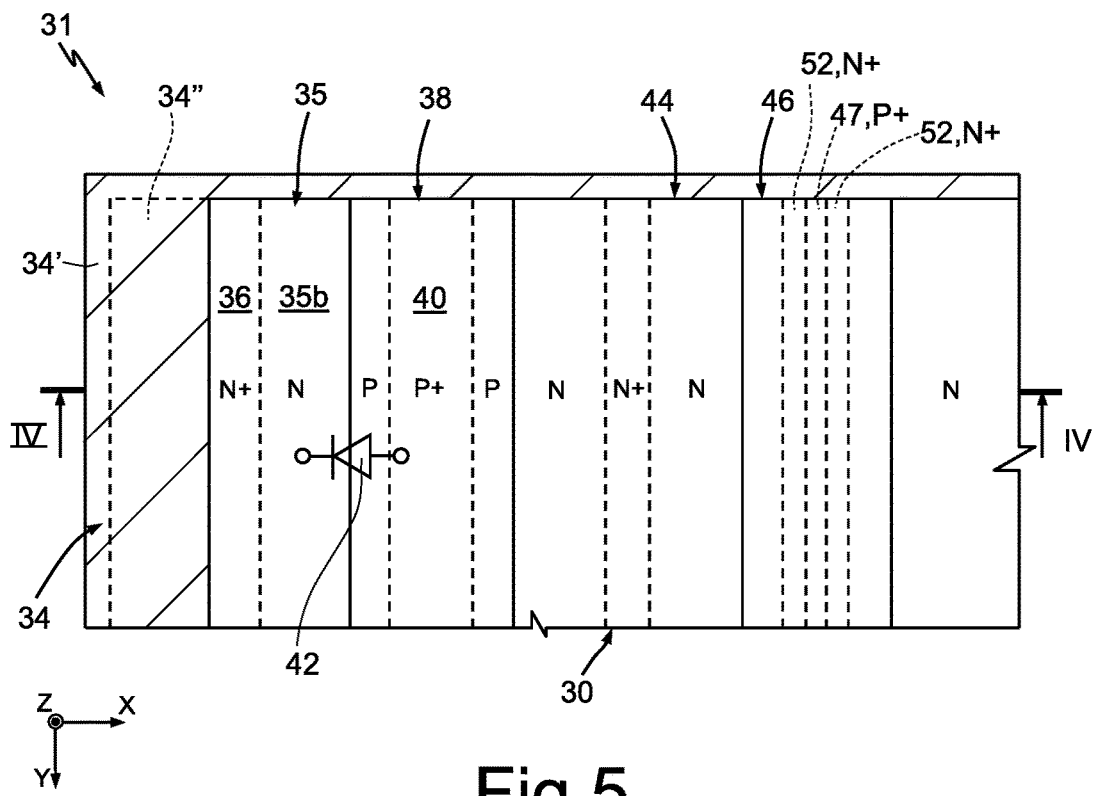
FIG. 5 is a top view of a portion of the MOSFET device of FIG. 4.
Figure 4:
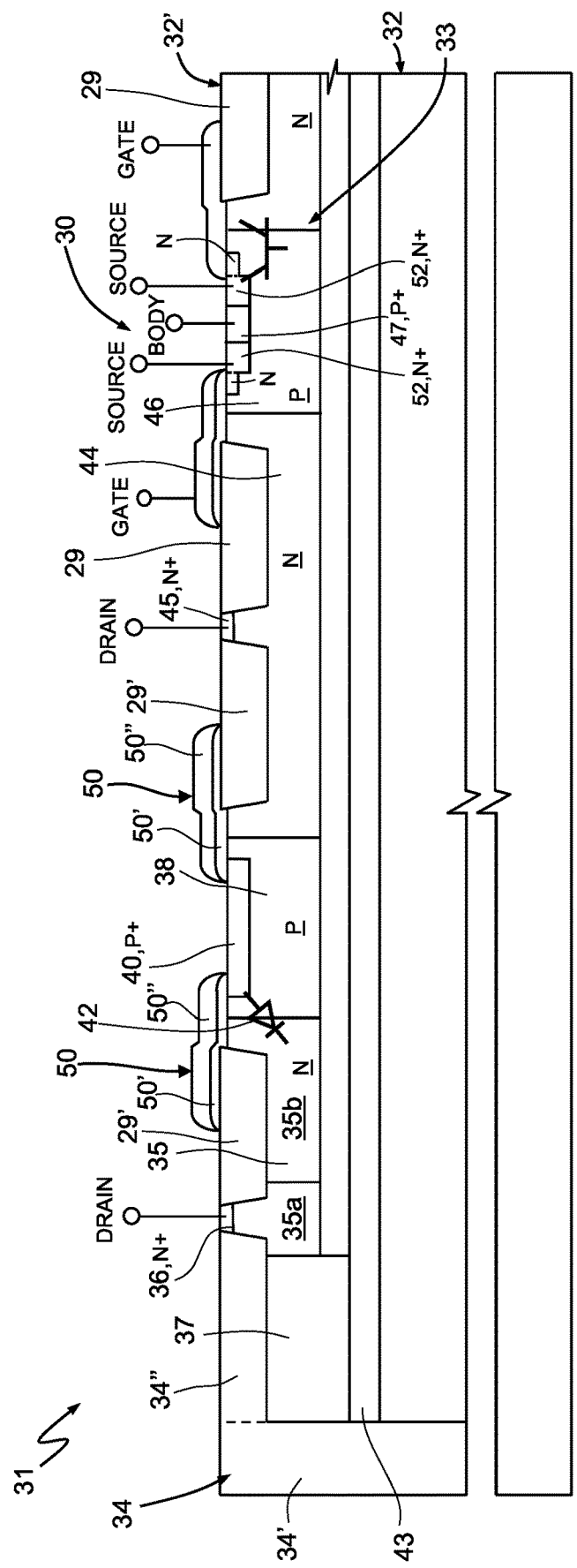
FIG. 4 is a cross-section view of a portion of a MOSFET device according to an embodiment.

FIG. 4 shows, in a cross section view, a portion of the device 30. FIG. 5 is a top plan view of a portion of device 30 of FIG. 4. It is noted that FIG. 4 is taken along the cut line IV-IV shown in FIG. 5.

In FIG. 5, only the elements useful for the understanding of the embodiment are shown.

FIGS. 4 and 5 are represented in a Cartesian coordinate system of three axes X, Y, Z orthogonal to one another.

With joint reference to FIGS. 4 and 5, the device 30 comprises a structural body 32, for example made of semiconductor material such as silicon (Si) or including silicon. In the structural body 32 extends, in a per se known way, a body region 46, at least drain region 44 and at least a source region 52 (in FIGS. 4 and 5, two source regions 52 are shown). The body region 46 houses a body contact region 47, of P+ type and the at least one source region 52 (here, also another source region 52 is shown), of N+ type, arranged next to the body contact region 47.

The device 30 may comprise a plurality of drain-body-source regions, according to the needs and the design of the device 30. The drain-body-source regions extend in an active area 33 of the device 30, i.e., the area where a source-drain current path is formed during use. It is noted that the current-flow in the device 30 is horizontal, i.e. along the X axis.

The active area 33 is delimited by field oxide 29.

The term "active area" is to be interpreted, in the following description, as the area of the structural body 32 containing the drain, body and source regions of the device 30, and where the source-drain current path is formed during use. Since the device 30 may comprise a plurality of body/source and drain regions, the term "active area" is to be interpreted as the sum of all the active areas belonging to the device 30.

It is moreover noted that, in the context of the embodiment, the term "structural body" may include a solid body formed by one or more layers of semiconductor material, such as a substrate and/or epitaxial layers of intrinsic type, or having a doping of P or N type, according to the circuit needs. Other intermediate layers, of insulating or conducting materials, or doped regions, may be present. The formation of the structural body 32 is not critical to the present invention and therefore it is not further described. The term "substrate" is also used, in the following description, with the same meaning of "structural body".

A protection frame 34 is optionally present, and includes a trench extending deep into the structural body 32, filled with insulating material such as silicon dioxide ($SiO_2$); the protection frame 34 delimits externally the active area 33 of the device 30. The protection frame 34 may be designed having, in top plan view (i.e., in view on the XY plane), a squared shape; however, any other shape is possible, such as oval, circular or generally polygonal. The protection frame 34 extends in depth into the structural body 32, along the Z axis, with the aim of electrically insulating the active area 33 of the device 30 from neighboring electronic devices (not shown), which may be integrated in the same die 31.

The protection frame 34 extends along the Z axis for a maximum depth which is chosen in the design phase, for example in the range 2-30 μm.

More in detail, the protection frame 34 may include a first subregion 34', extending to a first depth (e.g., the above identified depth of 2-30 μm) in the structural body 32, and a second subregion 34" extending to a second depth, lower than the first depth, in the structural body 32. The first and the second subregions 34', 34" are adjacent to one another.

In an alternative embodiment, the second subregion 34" may not be present and the protection frame 34 is formed by the first subregion 34' only; in a further embodiment, the first subregion 34' may not be present and the protection frame 34 is formed by the second subregion 34" only.

The device 30 further comprises a first junction region 35, defined by an implanted region of N type facing, at least in part, a surface 32' of the structural body 32. The first junction region 35 includes a first contact region 36 of N+ type, which can be electrically coupled to a metallization (not shown), for biasing purposes.

Between the first junction region 35 and the protection frame 34, along the X axis, an isolation region 37, specifically an N-type well (implanted region), is optionally present. The isolation region 37 has the function of improving robustness of the device 30, aiding to sustain high voltages during use, reducing the impact of the voltage on the portions of the structural body 32 extending below. The isolation region 37 is adjacent, and therefore electrically coupled, to the first junction region 35 and extends within the structural body 32 for a depth, along Z axis, greater than a depth of the first junction region 35.

A further N-type, highly doped, region 43 is optionally present in the structural body 32, under the isolation region 37. The doped region 43 extends entirely under the active area, and more specifically it extends for the entire area internally defined by the protection frame 34. In this way, the doped region 43 separates the active area 33 above it from the rest of the structural body 32 below it, and has the functions already reported in the known literature and which are not part of the present invention. The doped region 43 isolates the device 30 (and in particular, the active area 33) from the underlying portion of the structural body 32, thus drastically reducing the gain of the PNP bipolar transistor formed by the body-drain-substrate regions, and actively acts to improve the off-state breakdown voltage ($BV_{off}$) in multi-ReSurf (Reduced Surface Field) components.

The device 30 further comprises a second junction region 38, defined by an implanted region of P type facing, at least in part, the surface 32' of the structural body 32; the second junction region 38 extends next to, and adjacent to, the first junction region 35, when a direction parallel to the X axis is considered. In other words, the first junction region 35 and the second junction region 38 are in direct electrical contact with one another. Within the second junction region 38, facing the surface 32' of the structural body 32, a second contact region 40 of P+ type is present. The second junction region 38 forms, with the adjacent first junction region 35, a PN-junction diode 42. The diode 42 is therefore integrated within the die 31 which houses the device 30. More in particular, the diode 42 is integrated in the device 30 and, as detailed later on, shares with the device 30 some of the conduction terminals.

The diode 42 is substantially formed between oxide regions 29' which are analogous to the field oxide regions 29 (i.e., having the same layout, the same material, the same dimensions and formed in the same manufacturing step), and having the function of lateral electrical insulation.

In alternative embodiments, the second junction region 38 may extend partially under the oxide regions 29'.

Figure 2:
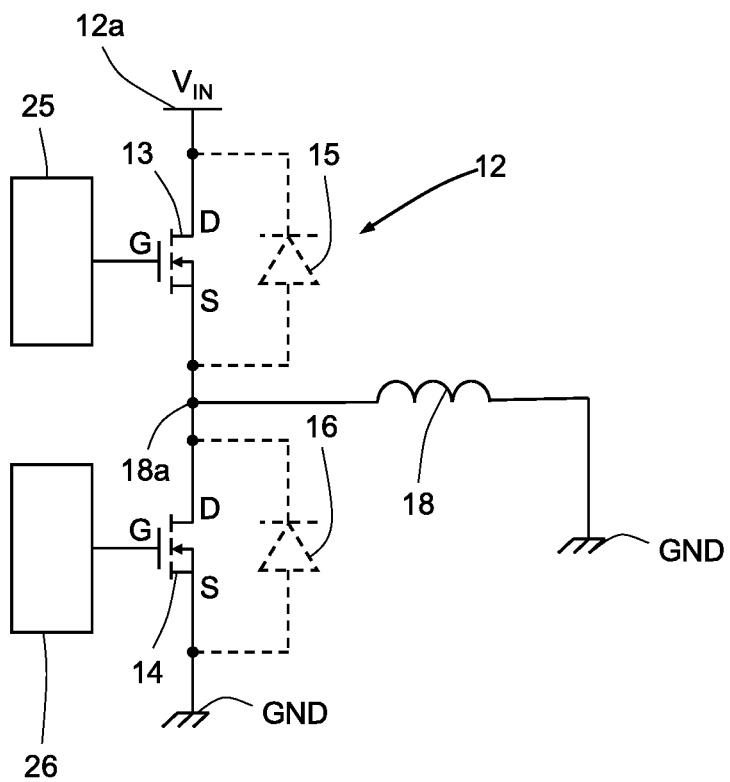
Figure 3:
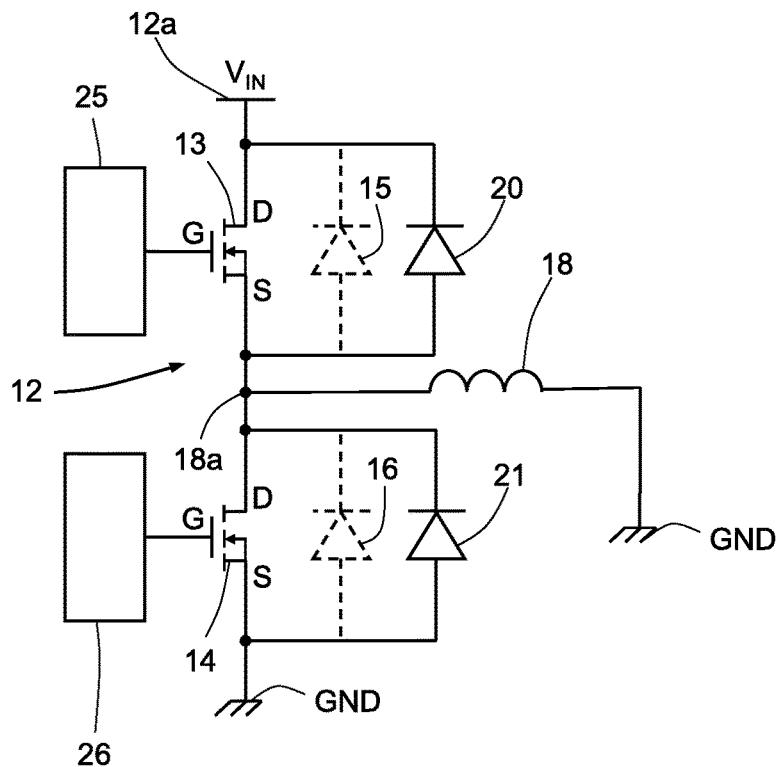

The dopant concentration of the first junction region 35, of the second junction region 38, and of the second contact region 40 are chosen such that the diode 42 is robust enough to sustain high and/or fast recirculation currents when the device 30 is used as one of the switches 13 or 14 of the circuit of FIG. 2 or FIG. 3.

To this end, it is noted that the first junction region 35 includes at least two subregions 35a, 35b. According to a non-limiting example, the subregion 35a has a doping concentration in the range $10^{15}$-$10^{17}$ $cm^{-3}$; this subregion 35a houses the above mentioned contact region 36 of N+ type and is adjacent to the isolation region 37. The other subregion 35b extends adjacent (along X axis) to the subregion 35a and has a doping concentration in the range, for example, $10^{15}$-$10^{17}$ $cm^{-3}$.

It is apparent from the above that, in some embodiments, the subregions 35a and 35b may have the same doping concentration and therefore, in such embodiments, the first junction region 35 has a uniform doping concentration.

According to a non-limiting example, the second junction region 38 has a doping concentration in the range $10^{16}$-$10^{18}$ $cm^{-3}$ while the second contact region 40 has a doping concentration in the range $10^{19}$-$10^{20}$ $cm^{-3}$. It is noted that the second contact region 40 is completely contained in the second junction region 38.

In a top-plan view on the XY plane, the first junction region 35 and the second junction region 38 have a string-like, or finger-like, shape (i.e., substantially rectangular), with a main direction of extension (main side of the rectangular shape) along the Y axis. See FIG. 5. The first and the second junction regions 35, 38 are in reciprocal contact at a respective main side.

At a side of the second junction region 38 which is opposite to the side adjacent to the first junction region 35, a further implanted region, of N type, is present. This further implanted region is the drain region 44 of the device 30 and is manufactured in a per se known way. The drain region 44 includes a drain contact region 45, of N+ type. Next to the drain region 44, the body region 46 is present.

As already discussed, the active area is completely contained within the protection frame 34.

A further PN-junction diode (not shown), analogous to the diode 42, is arranged on the opposite side of the active area 33 with respect to the side where the PN junction diode 42 is formed; according to an embodiment, this further diode separates the active area 33 from the protection frame 34.

According to a non-limiting embodiment, for what concern the sequence of drain-body-source regions, the device 30 is, in top-plan view, symmetric with respect to an axis of symmetry passing through the center of the (circular or polygonal) shape defined by the protection frame 34. More in particular, the axis of symmetry is parallel to the Y direction.

In other words, irrespective of the specific embodiment, the active area 33 of the device 30 is separated from the protection frame 34 by a respective PN-junction diode on both sides along the X axis, so that the undesired formation of a parasite bipolar transistor of NPN type (formed by N-type drain, P-type body, N-type source) is avoided in the lateral, peripheral, regions of the device 30, namely close to the protection frame 34. In fact, the most external drain fingers of a known DMOS device are subject, during recirculation and turn-off, to higher current compared to internal fingers. By interposing a PN diode on peripheral sides of the device 30 where high and/or fast recirculation current develops, the above issue is overcome, since the recirculation current is sustained by the PN diodes thus introduced.

The functionality of the device 30 is not altered by the integration of the PN diodes 42.

It is moreover noted that the cathode of the PN diode 42 corresponds to the first junction region 35, while the anode to the second junction region 38. The first junction region 35 is electrically coupled to the drain terminal of the device 30, while the second junction region 38 is electrically coupled to the source/body terminal of the device 30. More particularly, both cathodes of the two diodes 42 previously discussed are coupled to the same drain terminal of the device 30, and analogously both anodes are coupled to the same source terminal. That is to say that, during use and from an electrical point of view, the two PN junctions diodes 42 act as if they were a single diode coupled in parallel to the device 30.

Moreover, it is noted that also the isolation region 37, when present, is biased at the drain potential.

A metal-oxide stack 50 is optionally present above the surface 32' of the structural body 32 in the region where the PN diode 42 has been formed and, in particular, at the junction between the first and second regions 35, 38. More specifically, the metal-oxide stack 50 comprises an oxide layer (more generally, an electrical-isolation layer) 50' extending in contact with the surface 32' of the structural body 32, and a metal layer (more generally, a conductive layer) 50" extending on the oxide layer 50'. The metal-oxide stack 50, which structurally corresponds to the gate stack of the device 30, functions as a field plate for the diode 42.

The metal-oxide stack 50 can be biased at gate or source potential; however, other voltages, suitable to device functioning, can be applied.

From an examination of the characteristics of the device obtained according to the present disclosure the advantages that it affords are evident.

In particular, the integration of the diode 42 does not require any additional step to the current process, since both junction regions 35 and 38 can be manufactured during the same steps used to form the drain implant and the body implant respectively.

The obtained MOSFET device is robust and able to sustain high and fast recirculation currents even in the absence of an externally coupled diode.

Finally, it is clear that modifications and variations may be made to what has been described and illustrated herein without thereby departing from the sphere of protection of the present invention, as defined in the annexed claims.

In a previously disclosed embodiment, device separation on the same die 31 is achieved through oxide-filled trench 34. However, other technical solutions to isolate devices on the same die may be used, such as reverse-biased junctions.

In the case where the device 30 is the only device on the die 31, or in case that interference between devices in the same die 31 is not an issue, the protection frame 34 is not present.

The diode 42 (as well as the further diode on the opposite side of the active area) can be either a PN-junction diode, or an integrated Zener diode, or a Schottky, or a diode of another type.

According to further embodiments, the device 30 may be an external source device.

According to further embodiments, the second junction region 38 (and the region 40 contained therein) can be replaced by a metal-semiconductor junction such as a Schottky junction.

Furthermore, the diode 42 can be manufactured in such a way that the anode and the cathode regions are switched along the X axis with respect to the embodiment shown in FIG. 4. In particular, the anode region (in FIG. 4, the P-type region 38) is formed next to the protection frame 34 (in particular, facing first subregion 34' and at least partially below the second subregion 34"), while the cathode region (in FIG. 4, the N-type region 35) is formed facing the active area 33 of the device 30.

Moreover, the design of the device can be applied to N-channel MOSFETs as well as to P-channel MOSFETs, as it is apparent to the skilled person in the art.

It is further noticed that the design of the device can be applied to MOSFET devices having an annular edgeless structure, i.e., with body, source and drain regions having, in top plan view, a circular shape (or generally polygonal).

According to the layout chosen for the body, source and drain regions, the diodes 42 may have a shape chosen accordingly, an extending only in part at opposite sides of the active area (e.g., completely around the active area).

The invention claimed is:

1. A MOSFET device, comprising:
    a structural body made of semiconductor material, wherein the structural body includes:
        an active area housing a drain region, a body region in contact with the drain region and a source region within the body region, wherein the drain region, body region and source region are reciprocally arranged such that, during use, a current path is formed between the drain and the source regions along a first axis; and
        a first PN-junction and a second PN-junction respectively arranged at least in part on opposite sides of the active area along said first axis, wherein each PN-junction includes a first junction region in contact with the drain region and a second junction region in contact with the first junction region;
    wherein the first and the second PN-junctions form a first diode and a second diode, respectively, wherein the first junction region is electrically coupled to one among the drain region and the source region of the MOSFET device and the second junction region is electrically coupled to the other among the source region and the drain region of the MOSFET device; and
    wherein said first junction region is adjacent to the second junction region, the first and second junction regions being integrated within the structural body, wherein the second junction region is not in physical contact with the drain region, and wherein the first junction region is positioned between the second junction region and the drain region along said first axis.

2. The MOSFET device according to claim 1, wherein the body region, the drain region and the source region have, in top plan view, a respective finger-like shape with a main direction of extension of each finger along a second axis orthogonal to the first axis.

3. The MOSFET device according to claim 1, further comprising an electrical-isolation trench, extending in the structural body and surrounding the structural body including the active area, the first and second junction regions of the first and the second PN-junctions being integrated in the structural body between the active area and the electrical-isolation trench.

4. The MOSFET device according to claim 3, wherein each second junction region faces said electrical-isolation trench along a second axis orthogonal to the first axis.

5. The MOSFET device according to claim 1, wherein the first junction region forms the anode of the first diode and the second junction region forms the cathode of the first diode.

6. The MOSFET device according to claim 1,
    wherein each second junction region includes a first subregion having a first doping value and a second subregion having a second doping value lower than the first doping value, and
    wherein each first junction region includes a third subregion having a third doping value and a fourth subregion having a fourth doping value lower than the third doping value,
    the first and third subregions forming respective contacts for biasing, during use, the respective second and first junction regions.

7. The MOSFET device according to claim 6, wherein PN-junctions are formed by direct contact of the second and the fourth subregions.

8. The MOSFET device according to claim 1, wherein the second junction region has a doping concentration in the range $10^{15}$-$10^{17}$ atoms/cm$^3$, and the first junction region has a doping concentration in the range $10^{16}$-$10^{20}$ atoms/cm$^3$.

9. The MOSFET device according to claim 1, wherein the first type of conductivity is P and the second type of is N.

10. The MOSFET device according to claim 1, wherein cathodes of the first and second diodes at the second junction regions are electrically connected together and electrically connected to the drain region, and anodes of the first and second diodes at the first junction regions are electrically connected together and electrically connected to the source region, so that, during use, the first and the second diodes act as one single diode.

11. A MOSFET device, comprising:
a semiconductor body surrounded by an insulating frame;
an active region within the semiconductor body, said active region comprising a drain region doped with a first conductivity type, a body region doped with a second conductivity type in contact with the drain region and a source region doped with the first conductivity type within the body region;
a first junction region within the semiconductor body, said first junction region doped the second conductivity type and positioned in contact with the drain region;
a second junction region within the semiconductor body, said second junction region doped the first conductivity type and positioned in contact with the first junction region;
wherein the first and second junction regions form a PN-junction of a diode;
an electrical connection of the second junction region to the drain region; and
a metal-oxide stack extending over a junction between the first and second junction regions.

12. The device of claim 11, further comprising an insulated gate extending over the body region.

13. The device of claim 12, wherein a conductive portion of the metal-oxide stack is biased at a same potential as the insulated gate.

14. The device of claim 11, wherein a conductive portion of the metal-oxide stack is biased at a same potential as the source region.

15. The device of claim 11, further comprising an electrical connection of the first junction region to the source region.

16. The device of claim 11:
wherein the first junction region includes a first subregion having a first doping value and a second subregion having a second doping value lower than the first doping value; and
wherein the second junction region includes a third subregion having a third doping value and a fourth subregion having a fourth doping value lower than the third doping value;
the first and third subregions forming respective contacts for biasing the first and second junction regions, respectively.

17. The device of claim 16, wherein the second subregion is in contact with the drain region.

18. The device of claim 16, wherein the PN-junction is formed by direct contact of the second and the fourth subregions.

19. The device of claim 11, wherein the first type of conductivity is N and the second type of conductivity is P.

20. A MOSFET device, comprising:
a structural body made of semiconductor material, wherein the structural body includes:
an active area housing a drain region, a body region in contact with the drain region and a source region within the body region, wherein the drain region, body region and source region are reciprocally arranged such that, during use, a current path is formed between the drain and the source regions along a first axis; and
a first PN-junction and a second PN-junction respectively arranged at least in part on opposite sides of the active area along said first axis, wherein each PN-junction includes a first junction region in contact with the drain region and a second junction region in contact with the first junction region;
wherein the first and the second PN-junctions form a first diode and a second diode, respectively, wherein the first junction region is electrically coupled to one among the drain region and the source region of the MOSFET device and the second junction region is electrically coupled to the other among the source region and the drain region of the MOSFET device; and
a metal-oxide stack extending over a junction between the first and second junction regions.

21. The device of claim 20, wherein a conductive portion of the metal-oxide stack is biased at a same potential as an insulated gate extending over the body region.

22. The device of claim 20, wherein a conductive portion of the metal-oxide stack is biased at a same potential as the source region.

23. The MOSFET device according to claim 20, wherein the body region, the drain region and the source region have, in top plan view, a respective finger-like shape with a main direction of extension of each finger along a second axis orthogonal to the first axis.

24. The MOSFET device according to claim 20, further comprising an electrical-isolation trench, extending in the structural body and surrounding the structural body including the active area, the first and second junction regions of the first and the second PN-junctions being integrated in the structural body between the active area and the electrical-isolation trench.

25. The MOSFET device according to claim 24, wherein each second junction region faces said electrical-isolation trench along a second axis orthogonal to the first axis, and each first junction region is adjacent to one respective second junction region and arranged between the respective second junction region and the active area.

26. The MOSFET device according to claim 20, wherein said first junction region has a first type of conductivity and is adjacent to the second junction region having a second type of conductivity, the first and second junction regions being integrated within the structural body.

27. The MOSFET device according to claim 26, wherein the first junction region forms the anode of the first diode and the second junction region forms the cathode of the first diode.

28. The MOSFET device according to claim 26, wherein each second junction region includes a first subregion having a first doping value and a second subregion having a second doping value lower than the first doping value, and
wherein each first junction region includes a third subregion having a third doping value and a fourth subregion having a fourth doping value lower than the third doping value, the first and third subregions forming respective contacts for biasing, during use, the respective second and first junction regions.

29. The MOSFET device according to claim 28, wherein PN-junctions are formed by direct contact of the second and the fourth subregions.

30. The MOSFET device according to claim 26, wherein the second junction region has a doping concentration in the range $10^{15}$-$10^{17}$ atoms/cm$^3$, and the first junction region has a doping concentration in the range $10^{16}$-$10^{20}$ atoms/cm$^3$.

31. The MOSFET device according to claim 26, wherein the first type of conductivity is P and the second type of conductivity is N.

32. The MOSFET device according to claim 20, wherein the cathodes of the first and second diodes are electrically connected together, and the anodes of the first and second diodes are electrically connected together, so that, during use, the first and the second diodes act as one single diode.

\* \* \* \* \*